(12) United States Patent
Honjo et al.

(10) Patent No.: US 8,154,348 B2
(45) Date of Patent: Apr. 10, 2012

(54) AMPLIFIER CIRCUIT

(75) Inventors: Kazuhiko Honjo, Tokyo (JP); Yoichiro Takayama, Tokyo (JP); Ryo Ishikawa, Tokyo (JP)

(73) Assignees: The University of Electro-Communications, Tokyo (JP); Campus Create Co., Ltd., Tokyo (JP)

( * ) Notice: Subject to any disclaimer, the term of this patent is extended or adjusted under 35 U.S.C. 154(b) by 0 days.

(21) Appl. No.: 12/872,589

(22) Filed: Aug. 31, 2010

(65) Prior Publication Data

US 2011/0050350 A1   Mar. 3, 2011

(30) Foreign Application Priority Data

Aug. 31, 2009   (JP) .................................. 2009-200817

(51) Int. Cl.
    *H03F 3/191*   (2006.01)
(52) U.S. Cl. ........................... 330/302; 330/306
(58) Field of Classification Search .................. 330/251, 330/302, 306
    See application file for complete search history.

(56) References Cited

U.S. PATENT DOCUMENTS

| | | | |
|---|---|---|---|
| 6,177,841 B1 * | 1/2001 | Ohta et al. | 330/302 |
| 7,161,434 B2 * | 1/2007 | Rhodes | 330/302 |
| 7,741,907 B2 * | 6/2010 | Takagi | 330/251 |

FOREIGN PATENT DOCUMENTS

| | | |
|---|---|---|
| JP | 2003-234626 A | 8/2003 |
| JP | 2005-117200 A | 4/2005 |
| JP | 2009-130472 A | 6/2009 |

OTHER PUBLICATIONS

Woo, Y. Y. et., al. "Analysis and Experiments for High-Efficiency Class-F and Inverse Class-F Power Amplifiers", IEEE Transactions on Microwave Theory and Techniques, vol. 54, No. 5, May 2006, pp. 1969-1974.

* cited by examiner

*Primary Examiner* — Khanh Nguyen
(74) *Attorney, Agent, or Firm* — Sughrue Mion, PLLC

(57) ABSTRACT

An amplifier circuit operating at a fundamental angular frequency $\omega_0$, includes: a transistor which is represented by an equivalent circuit which includes: an equivalent output current source, a drain-source capacitor as a parallel parasitic capacitor to an output node of the equivalent output current source, and a drain inductor as serial parasitic inductor connected between the equivalent output current source and a drain output node; a harmonic frequency processing circuit which includes an input node connected with the drain output node and an output node; a resonant circuit section provided between the output node of the harmonic frequency processing circuit and a ground node and comprising (2n+1) resonators which have resonance frequencies different from each other; and a load resistance provided in a back stage of the harmonic frequency processing circuit. The resonance frequencies of the (2n+1) resonators are coincident with frequencies of (n+1) poles and n zeros formed between the drain output node and the ground node in the transistor when the output node of the harmonic frequency processing circuit is short-circuited to the ground node.

4 Claims, 4 Drawing Sheets ered, for example, as shown in Patent Literatures 1, 2, and 3, the Class-F and inverse Class-F amplifier circuits can be achieved over any orders up to an infinite order.
AMPLIFIER CIRCUIT

INCORPORATION BY REFERENCE

This patent application claims a priority on convention based on Japanese Patent Application No. 2009-200817 filed on Aug. 31, 2009. The disclosure thereof is incorporated herein by Reference.

TECHNICAL FIELD

The present invention relates to an amplifier circuit using a transistor.

BACKGROUND ART

A case is assumed that impedance when viewing a side of a load from a transistor output terminal is short-circuited for even-order harmonics and opened for odd-order harmonics. In such a case, an output in the even-order harmonics includes only a current component while an output in the odd-order harmonics includes only a voltage component. That is, there is no power consumption in a harmonics circuit. Moreover, if setting a power factor in a fundamental wave to be −1, 100% power efficiency can be achieved. An amplifier circuit adopting this principle is known as a Class-F amplifier circuit.

On the contrary, a case is assumed that the impedance when viewing the load side from the transistor output terminal is opened for the even-order harmonics and short-circuited for the odd-order harmonics. In such a case, the output in the even-order harmonics includes only the voltage component while the output in the odd-order harmonics includes only a current component. That is, there is no power consumption in the harmonics. Moreover, if setting a power factor in the fundamental wave to be −1, 100% power efficiency can be achieved. An amplifier circuit adopting this principle is known as an inverse Class-F amplifier circuit.

FIG. 1 is a circuit diagram showing a configuration of a conventional amplifier circuit. This circuit includes an equivalent circuit of a transistor 1, a matching circuit 19, and a load resistor 18. The equivalent circuit of the transistor 1 includes an equivalent output current source 7, a drain-to-source capacitor 8, and a drain inductor 9.

Here, the drain-to-source capacitor 8 and the drain inductor 9 in the transistor 1 are a parasitic capacitor and a parasitic inductor, respectively. In a case where the parasitic capacitor and the parasitic inductor in the transistor 1 are not considered, for example, as shown in Patent Literatures 1, 2, and 3, the Class-F and inverse Class-F amplifier circuits can be achieved over any orders up to an infinite order.

However, in an actual transistor, there are parasitic elements such as the drain-to-source capacitor and the drain inductor. Especially, in a high-frequency region such as a microwave frequency range and a millimeter wave frequency range, influence of these parasitic elements cannot be ignored, and the efficiency is not improved even if the order of harmonics to be processed is increased in a load circuit.

For this reason, a Class-F amplifier circuit and an inverse Class-F amplifier circuit have been studied in which the parasitic capacitor and the parasitic inductor in a transistor are considered. In Non-Patent Literature 1, a technique is disclosed in which a load conditions in the Class-F amplifier circuit and the inverse Class-F amplifier circuit are achieved up to the third harmonic wave in consideration of the parasitic capacitor and the parasitic inductor in the transistor.

However, no circuit is known which processes the fourth and the higher order harmonics. Accordingly, in an actual design, a trial design is made under the assumption that there is no parasitic element in a semiconductor element, and then it is necessary to perform experimental readjustment. In this case, it is very difficult to make the adjustment simultaneously in consideration of termination conditions of a large number of harmonics. Even if power efficiency of 100% can be achieved through adoption of the Class-F and inverse Class-F amplifier circuits in principle, the power efficiency in a microwave band has remained at approximately 80%.

CITATION LIST

[Patent Literature 1]: JP 2003-234626A
[Patent Literature 2]: JP 2005-117200A
[Patent Literature 3]: JP 2009-130472A
[Non-Patent Literature 1]: Y. Y Woo, et al., "Analysis and Experiments for High Efficiency Class-F and inverse Class-F power amplifier", IEEE Trans. Microwave Theory and Techniques, vol. 54, no. 5, pp. 1969-1974, May 2006.

SUMMARY OF THE INVENTION

It is a subject matter of the present invention to provide an amplifier circuit satisfying the load condition in a Class F or inverse Class F amplifier circuit over the fourth and the higher order harmonics while using a transistor having a parasitic capacitor and a parasitic inductor, which are not ignorable.

In an aspect of the present invention, an amplifier circuit operating at a fundamental angular frequency $\omega_0$, includes: a transistor which is represented by an equivalent circuit which includes: an equivalent output current source, a drain-source capacitor as a parallel parasitic capacitor to an output node of the equivalent output current source, and a drain inductor as a serial parasitic inductor connected between the equivalent output current source and a drain output node; a harmonic wave processing circuit which includes an input node connected with the drain output node; an output node; and a ladder circuit of n (n=1, 2, 3, . . . ) stages provided between the input node and the output node, wherein each of the n stages comprises a parallel capacitor and a serial inductor; a resonant circuit section provided between the output node of the harmonic wave processing circuit and a ground node (voltage) and comprising (2n+1) resonators which have resonance frequencies different from each other; and a load resistance provided in a back stage of the harmonic wave processing circuit. The resonance frequencies of the (2n+1) resonators are coincident with frequencies of (n+1) poles and n zeros formed between the drain output node and the ground node in the transistor when the output node of the harmonic wave processing circuit is short-circuited to the ground node. The resonant frequencies of 2n resonators of the (2n+1) resonators are coincident with a frequency ($2\omega_0$) of second harmonic wave to a frequency of $(2n+1)^{th}$ harmonic wave $((2+1)\omega_0)$, respectively.

According to an amplifier circuit of the present invention, even by use of a transistor having a parasitic capacitor and a parasitic inductor which are not ignorable, a Class-F load condition or an inverse Class-F load condition over fourth and higher-order harmonics can be satisfied.

DESCRIPTION OF EMBODIMENTS

Hereinafter, an amplifier circuit according to the present invention will be described in detail with reference to the attached drawings.

First Embodiment

Figure 1:
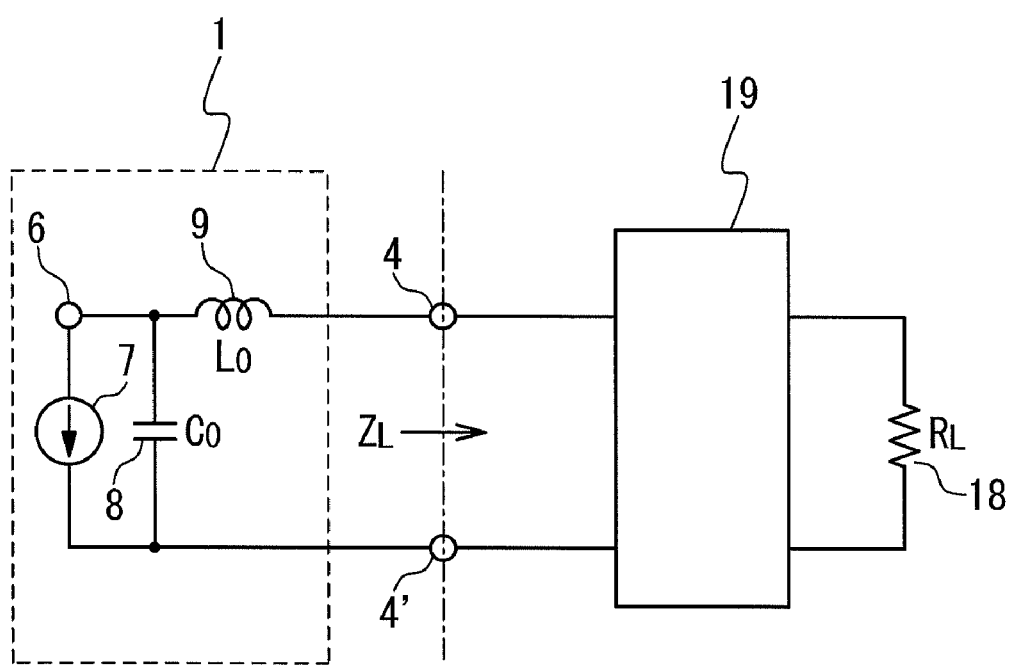
FIG. 1 is a circuit diagram showing a configuration of a conventional amplifier circuit.
Figure 2:
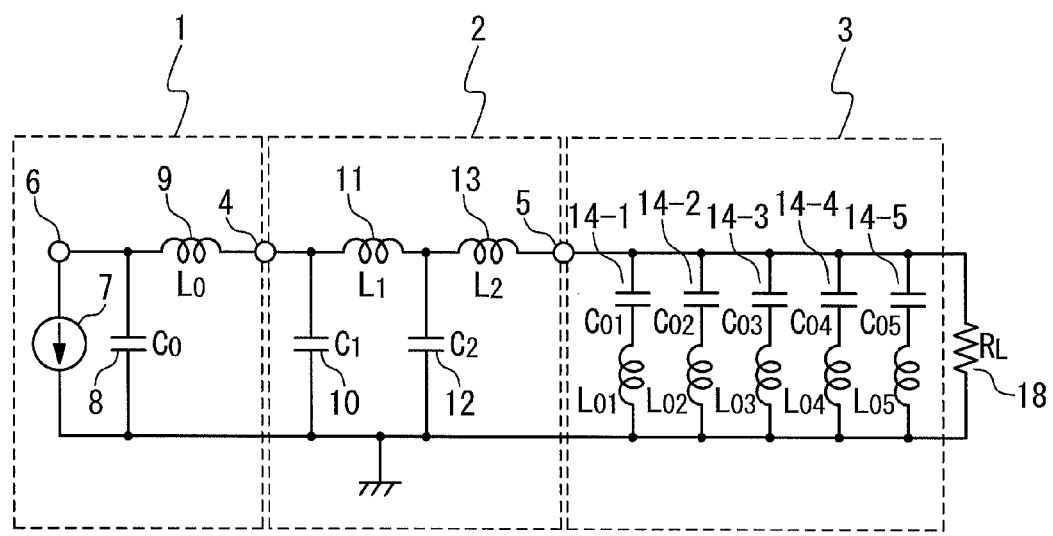
FIG. 2 is a circuit diagram showing a configuration of an amplifier circuit according to a first embodiment of the present invention.

FIG. 2 is a circuit diagram showing a configuration of the amplifier circuit according to the first embodiment of the present invention. The amplifier circuit includes a transistor section 1, a harmonics processing circuit section 2, a resonant circuit section 3, and an optional load resistor 18 ($R_L$).

The transistor section 1, the harmonic processing circuit section 2, the resonant circuit section 3, and the optional load resistor 18 ($R_L$) are connected in series in this order.

The transistor section 1 will be described below. The transistor section 1 expresses a transistor by its equivalent circuit. In the equivalent circuit of the transistor, there are an equivalent output current source 7, a drain-to-source capacitor 8 (Co), and a drain inductor 9 (Lo). Here, the drain-to-source capacitor 8 (Co) is a parallel parasitic capacitor for an output node 6 of the equivalent output current source 7. The drain inductor 9 (Lo) is a series parasitic inductor between the equivalent output current source 7 and a drain output node 4.

The connection relation between components of the transistor section 1 will be described below. The drain output node 4 is connected to one end of the drain inductor 9 (Lo). The other end of the drain inductor 9 (Lo) is connected to one end of the drain-to-source capacitor 8 (Co) and the output node 6 on one end side of the equivalent output current source 7. The other end of the drain-to-source capacitor 8 (Co) and the other end of the equivalent output current source 7 are grounded.

The harmonics processing circuit section 2 will be described below. The harmonics processing circuit section 2 includes an input node 4, the first and the second capacitors 10 ($C_1$) and 12 ($C_2$), the first and the second inductors 11 ($L_1$) and 13 ($L_2$), and an output node 5. The input node 4 of the harmonics processing circuit section 2 and the drain output node 4 of the transistor section 1 are directly connected together, and thus expressed by the same reference numeral 4.

The connection relation between components in the harmonics processing circuit section 2 will be described below. The input node 4 is connected to one end of the first capacitor 10 ($C_1$) and one end of the first inductor 11 ($L_1$). The other end of the first inductor 11 ($L_1$) is connected to one end of the second capacitor 12 ($C_2$) and one end of the second inductor ($L_2$). The other end of the second inductor 13 ($L_2$) is connected to the output node 5. The respective other ends of the first and the second capacitors 10 ($C_1$) and 12 ($C_2$) are grounded.

In other words, the first capacitor 10 ($C_1$) and the first inductor 11 ($L_1$) operate as a first one-stage inverse-L type ladder circuit. Similarly, the second capacitor 12 ($C_2$) and the second inductor 13 ($L_2$) operate as a second one-stage inverse-L type ladder circuit. In the harmonics processing circuit section 2, the second one-stage inverse-L type ladder circuit is connected at the subsequent stage of the first one-stage inverse-L type ladder circuit.

The resonant circuit section 3 will be described below. The resonant circuit section 3 includes an output node 5 and first to fifth resonators 14-1 to 14-5. These first to fifth resonators 14-1 to 14-5 respectively include first to fifth capacitors ($C_{o1}$ to $C_{o5}$) and first to fifth inductors ($L_{o1}$ to $L_{o5}$), respectively. The output node 5 in the resonant circuit section 3 and the output node 5 in the harmonics processing circuit section 2 are directly connected together and thus expressed by the same reference numeral 5.

The connection relation between components in the resonant circuit section 3 will be described below. Respective one ends of the first to the fifth capacitors ($C_{o1}$ to $C_{o5}$) are connected to the output node 5. The respective other ends of the first to the fifth capacitors ($C_{o1}$ to $C_{o5}$) are connected to respective one ends of the first to the fifth inductors ($L_{o1}$ to $L_{o5}$). The respective other ends of the first to the fifth inductors ($L_{o1}$ to $L_{o5}$) are grounded.

In other words, in the resonant circuit section 3, the five resonators having resonance frequencies determined based on circuits of the capacitor and the inductor connected in series are connected in parallel. Here, the resonance frequencies of the respective five resonators are different from one another. It should be noted that there is possibly a case where zeros or poles derived from parasitic elements of the transistor are coincident with the frequencies cooperation harmonics of the amplifier (degeneracy), but such a case is a rare desirable case. The number of parallel resonators in such a case may be 2n.

One end of the load resistor 18 ($R_L$) is connected to the output node 5 of the resonant circuit section 3. The other end of the load resistor 18 ($R_L$) is grounded.

Due to zero impedance on resonance in these resonators 14-1 to 14-5, the output node 5 of the harmonics processing circuit section 2 is short-circuited to the ground node. Therefore, if the resonance frequencies are different from each other between these resonators 14-1 to 14-5, the short-circuit condition is satisfied in a plurality of desired operation frequencies.

As described above, the load resistor 18 ($R_L$) is connected between the output node 5 of the harmonics processing circuit section 2 and the ground node. An output signal of a base angular frequency $\omega_0$ can be taken out from the load resistor 18 ($R_L$). When the output node 5 of the harmonics processing circuit section 2 is short-circuited to the ground node, (n+1) poles and n zeros are formed between the input node 4 of the transistor section 1 and the ground node. Here, the resonance angular frequencies of the resonators are set to respectively coincide with frequencies of the (n+1) poles and the n zeros. At the same time, the resonance angular frequencies of four of the five resonators 14-1 to 14-5 are set to respectively coincide with the second harmonic wave ($2\omega_0$) to fifth harmonic wave ($5\omega_0$). Moreover, the resonance angular frequency of the remaining one resonator is set to coincide with a pseudo resonance angular frequency due to the parasitic element of the transistor.

FIG. 2 is an equivalent circuit when viewing a load side from the equivalent output current source 7 of the transistor section 1 in a case that the output node 5 is short-circuited to the ground node.

The equivalent circuit includes an output node 6 of the equivalent output current source 7, the first to the third capacitors 8 ($C_0$), 10 ($C_1$), and 12 ($C_2$), and the first to the third inductors 9 ($L_0$), 11 ($L_1$), and 13 ($L_2$).

The output node 6 is connected to one end of the first capacitor 8 ($C_0$) and one end of the first inductor 9 ($L_0$). The other end of the first inductor 9 ($L_0$) is connected to one end of the second capacitor 10 ($C_1$) and one end of the second inductor 11 ($L_1$). The other end of the second inductor 11 ($L_1$) is connected to one end of the third capacitor 12 ($C_2$) and one end of the third inductor 13 ($L_2$). The respective other ends of the first, the second, and the third capacitors 8 ($C_0$), 10 ($C_1$), and 12 ($C_2$) and the other end of the third inductor 13 ($L_2$) are grounded.

Input admittance Y(s) in the circuit shown in FIG. 2 is calculated from the following equation (1):

$$Y(s) = C_0 s + \cfrac{1}{L_0 s + \cfrac{1}{C_1 s + \cfrac{1}{L_1 s + \cfrac{1}{C_2 s + \cfrac{1}{L_2 s}}}}} \quad (1)$$

where s=jω.

On the other hand, the circuit in FIG. 2 is a pure reactance one-terminal pair circuit network. Typically, an admittance characteristic of the pure reactance one-terminal pair circuit network can be expressed by the following equation (2):

$$Y(s) = \frac{a_0 a_2 s^2 + a_4 s^4 + a_6 s^6}{b_1 s + b_3 s^3 + b_5 s^5} = M \frac{(s^2 + \omega_1^2)(s^2 + \omega_3^2)(s^2 + \omega_5^2)}{s(s^2 + \omega_2^2)(s^2 + \omega_4^2)} \quad (2)$$

where Y(s) in the equation (1) and Y(s) in the equation (2) show admittances of the same circuit.

In the equation (2), $\omega_1$, $\omega_3$, and $\omega_5$ are angular frequencies when a numerator of an admittance function is zero, that is, show poles in an impedance function. Similarly, in the equation (2), $\omega_2$ and $\omega_4$ are angular frequencies when a denominator of the admittance function is zero, that is, represent zeros of the impedance function.

Moreover, in the equation (2), $M = a_6/b_5$.

By previously setting impedance at each harmonic wave when viewing the load side from the equivalent output current source 7, to be zero or infinite (pole), that is, setting the admittance to be infinite (corresponding to zero of impedance) or zero (corresponding to an pole of the impedance) based on the equation (2), the Class-F load condition or an inverse Class-F load condition is specified. At the same time, a pole with no relation to the Class-F operation or the inverse Class-F operation is generated by the parasitic elements C0 and L0. Thus, it is possible to provide as an ideal Class-F frequency characteristic or an inverse Class-F frequency characteristic, the frequency characteristic when viewing the load side from the equivalent output current source 7 in the state in which the parasitic elements of the transistor are considered.

For example, it is assumed that $\omega_0$ is a fundamental angular frequency, $\omega_2 = 2\omega_0$ and $\omega_4 = 4\omega_0$ are zeros, $\omega_3 = 3\omega_0$ and $\omega_5 = 5\omega_0$ are poles in the equation (2). In this case, it possible to provide a complete Class-F amplifier circuit which can process up to the fourth harmonic waves while considering influence of the parasitic elements of the transistor. At this time, $\omega_1$ serves as a pseudo resonance angular frequency due to the transistor parasitic elements.

A quotient and a residue equation are obtained by dividing the numerator by the denominator in the third term of the equation (2), and the numerator is divided by the denominator in this residue equation. By repeating this operation, an equation expressed by continued fraction can be obtained, as shown in the following equation (3):

$$Y(s) = \cfrac{1}{Ms + \cfrac{1}{\cfrac{1}{M(a-d)}s + \cfrac{1}{\cfrac{M(a-d)}{d - \cfrac{b-e}{a-d}}s + \cfrac{1}{\cfrac{\left(d - \cfrac{b-e}{a-d}\right)s}{K_1} + \cfrac{1}{\cfrac{K_1}{K_2}s + \cfrac{Mc}{K_2 s}}}}} \quad (3)$$

where a, b, c, d, e, $K_1$, and $K_2$ are defined as in the following equations (4) and (5):

$$\omega_1^2 + \omega_3^2 + \omega_5^2 \equiv a \quad (4)$$
$$\omega_1^2 \omega_3^2 + \omega_3^2 \omega_5^2 + \omega_5^2 \omega_1^2 \equiv b$$
$$\omega_1^2 \omega_3^2 \omega_5^2 \equiv c$$
$$\omega_2^2 + \omega_4^2 \equiv d$$
$$\omega_2^2 \omega_4^2 \equiv e$$

$$K_1 = M \left\{ (b-e) - \cfrac{\left(e - \cfrac{c}{a-d}\right)(a-d)}{d - \cfrac{b-e}{a-d}} \right\} \quad (5)$$

$$K_2 = \left(e - \cfrac{c}{a-d}\right) - \cfrac{\left(d - \cfrac{b-e}{a-d}\right)c}{\left\{(b-e) - \cfrac{\left(e - \cfrac{c}{a-d}\right)(a-d)}{d - \cfrac{b-e}{a-d}}\right\}}$$

By comparing coefficients in the equation (3) and the equation (1), it is possible to provide a complete Class-F load circuit which can perform harmonics processing up to the fourth harmonic wave while the parasitic elements of the transistor are considered. Each of circuit parameters is more specifically obtained as in the following equation (6):

$$C_0 = M \quad (6)$$
$$L_0 = \frac{1}{C_0(a-d)}$$
$$C_1 = \frac{C_0(a-d)}{\left(d - \cfrac{b-e}{a-d}\right)}$$
$$L_1 = \frac{\left(d - \cfrac{b-e}{a-d}\right)}{K_1}$$
$$C_2 = \frac{K_1}{K_2}$$
$$L_2 = \frac{K_2}{cC_0}$$

The following equation (7) can be obtained from the equations (6) and (4):

$$L_0 = \frac{1}{C_0(a-d)} = \frac{1}{C_0(\omega_1^2 + \omega_3^2 + \omega_5^2 - \omega_2^2 - \omega_4^2)} \quad (7)$$

A pseudo resonance angular frequency $\omega_1$ can be expressed as in the following equation (8) by use of the two zeros and the two poles as design items of the Class-F amplifier and the parasitic capacitor (C0) and the parasitic inductor ($L_0$) in the transistor:

$$\omega_1^2 = \frac{1}{L_0 C_0} - \omega_3^2 - \omega_5^2 + \omega_2^2 + \omega_4^2 = \frac{1}{L_0 C_0} - 14\omega_0^2 \quad (8)$$

On the other hand, it is assumed that $\omega_0$ is a fundamental angular frequency, $\omega_1=2\omega_0$ and $\omega_3=4\omega_3$ are zeros, $\omega_2=3\omega_3$ and $\omega_4=5\omega_0$ are poles in the equation (2). In this case, when $\omega_s$ is a pseudo resonance frequency in the equation (2), it is possible to provide a complete inverse Class-F amplifier circuit processing up to the fourth harmonic wave while the parasitic elements of the transistor are considered. In a case of the inverse Class-F amplifier circuit, a complete inverse Class-F load circuit can be provided which can perform processing not only on the fourth harmonic wave but also on up to the higher-order harmonics than the fourth harmonics.

Second Embodiment

Figure 4:
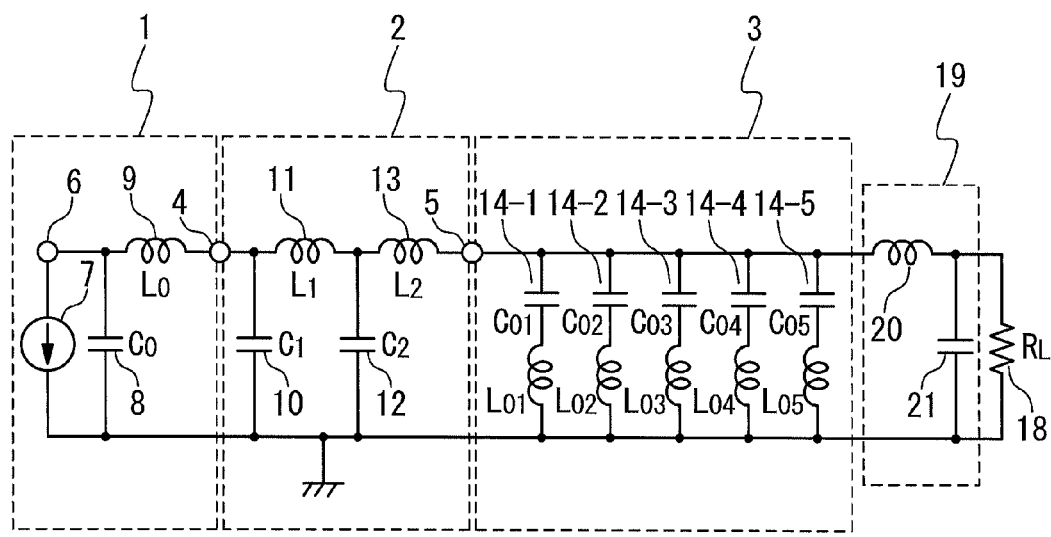
FIG. 4 is a circuit diagram showing a configuration of the amplifier circuit according to a second embodiment of the present invention.

FIG. 4 is a circuit diagram showing a configuration of the amplifier circuit according to a second embodiment of the present invention. The configuration of the amplifier circuit in the present embodiment is equivalent to the circuit obtained by adding the following changes to the amplifier circuit according to the first embodiment of the present invention. Specifically, the amplifier circuit in the present embodiment is the one obtained by adding a fundamental frequency impedance matching circuit 19 to the amplifier circuit of the first embodiment and also changing a connection position of the load resistor 18 from an output section of a high-frequency processing circuit section to an output section of the fundamental frequency impedance matching circuit 19.

A configuration example of the fundamental frequency impedance matching circuit 19 will be described below. As shown in FIG. 4, the fundamental frequency impedance matching circuit 19 includes an inductor 20 and a capacitor 21. One end of the inductor 20 is connected to an output node 5 of the high-frequency processing circuit section 2. The other end of the inductor 20 is connected to one end of the capacitor 21. The other end of the capacitor 21 is grounded. That is, in this configuration example, the fundamental frequency impedance matching circuit 19 is a one-stage filter circuit using the inductor and the capacitor.

A connection portion between the inductor 20 and the capacitor 21 corresponds to the output node of the fundamental frequency impedance matching circuit 19. A load resistor 18 is connected to the connection section between the inductor 20 and the capacitor 21.

It should be noted that the configuration example of the above fundamental frequency impedance matching circuit 19 is just one example and thus it may be a multiple-stage filter circuit or a distributed constant circuit.

The other configurations, connection relation between components, operation, etc. of the amplifier circuit of the present embodiment are the same as those of the first embodiment of the present invention. Thus, more detailed description thereof will be omitted.

Performing the fundamental frequency impedance matching by the fundamental frequency impedance matching circuit 19, it is possible to bring a power factor at the fundamental frequency closer to −1.

Third Embodiment

Figure 5:
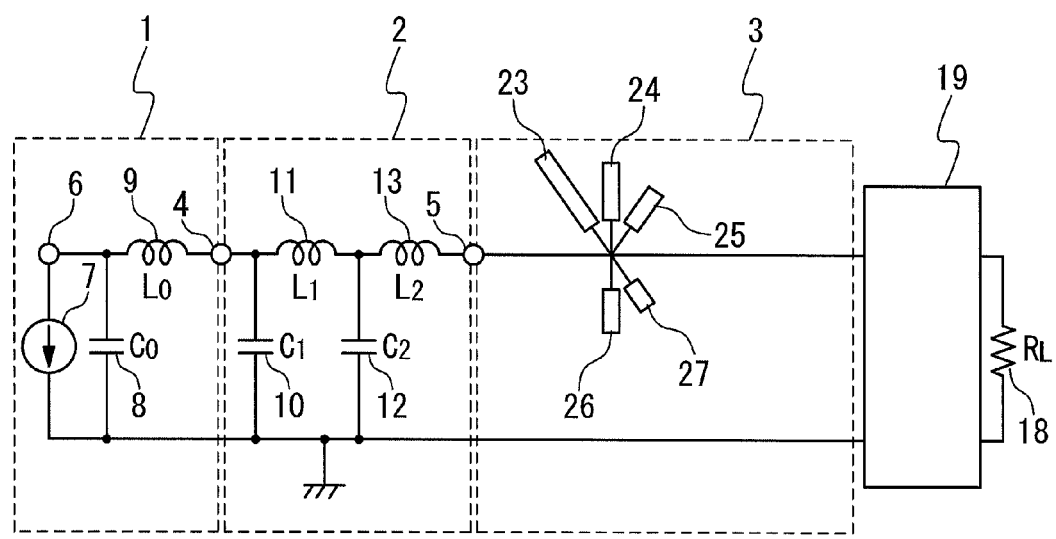
FIG. 5 is a circuit diagram showing a configuration of the amplifier circuit according to a third embodiment of the present invention.

FIG. 5 is a circuit diagram showing a configuration of the amplifier circuit according to a third embodiment of the present invention. The configuration of the amplifier circuit of the present embodiment is equivalent to a circuit obtained by adding the following changes to the amplifier circuit according to the second embodiment of the present invention. Specifically, while the resonant circuit section 3 includes a plurality of resonators 14-1 to 14-5 in the second embodiment of the present invention, the resonant circuit section 3 in the present embodiment includes a plurality of tip-open stubs 23 to 27. The plurality of tip-open stubs 23 to 27 correspond to the plurality of resonators 14-1 to 14-5 and have the same functions as those of the plurality of resonators 14-1 to 14-5.

Figure 3:
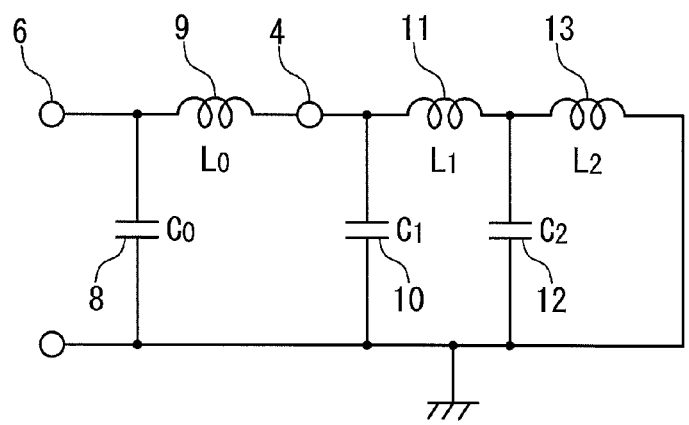
FIG. 3 is a circuit diagram showing an equivalent circuit when viewing from an equivalent output current source in a case that an output terminal 5 is short-circuited.

Respective ends of the plurality of tip-open stubs 23 to 27 are connected to an input node of the resonant circuit section 3. The length of each of the plurality of tip-open stubs 23 to 27 is set to a one-quarter wave length corresponding to a desired resonance frequency. Therefore, the resonant circuit section 3 in the present embodiment operates in the same manner as the resonant circuit section 3 according to the second embodiment of the present invention. The plurality of tip-open stubs 23 to 27 may be formed in the same manner as those in conventional technique described in FIG. 3 of the Patent Literature 1, but it is needless to say that they may be formed in a different method as long as they are short-circuited at a connection node with a plurality of desired resonance frequencies.

Other configuration, connection relation between components, operation, etc. of the amplifier circuit of the present embodiment are the same as those of the second embodiment of the present invention, and therefore more detailed description thereof will be omitted.

The first to third embodiments of the present invention may be combined in any combination within a technically consistence range. For example, in the amplifier circuit according to the third embodiment of the present invention, the existence of the fundamental frequency impedance matching circuit 19 is not always necessary and thus can be omitted. That is, the object of the present invention can be achieved even when the resonant circuit section 3 according to the first embodiment of the present invention is replaced with the resonant circuit section 3 according to the third embodiment of the present invention. Moreover, in the description of the first and second embodiments of the present invention, the resonant circuit section 3 includes the five resonators 14-1 to 14-5, but the resonant circuit section 3 is only required to include two or more resonators, which provides the same effect as the aforementioned effect. Moreover, a case that n=2 has been described here, but it is needless to say that n may be any positive integer number (n=1, 2, 3, or the like) and, for example, the number of resonators may be six or seven where n=3 or larger.

Figure 6:
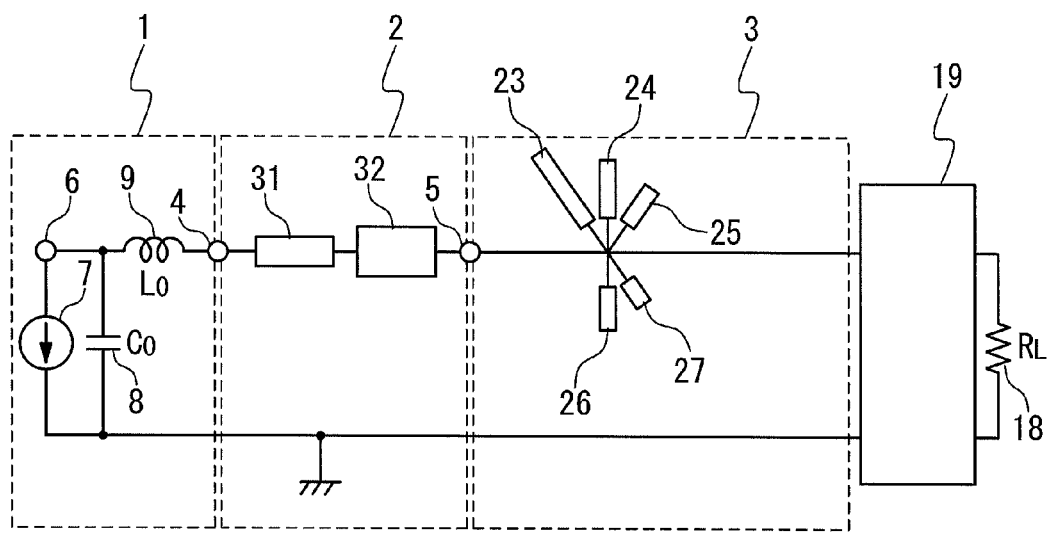
FIG. 6 is a circuit diagram showing a configuration of a modification of the amplifier circuit according to the third embodiment of the present invention.

FIG. 6 is a circuit diagram of a configuration of an equivalent circuit in which the harmonics processing circuit section 2 in the third embodiment is configured from distributed circuits 31 and 32. A ladder circuit of one stage of the serial inductor L and the parallel capacitor C has a characteristic impedance $Z_0$ shown in the following equation (9) and is equivalent to a distributed constant circuit of an electrical length θ. Here, ω₀ denotes the fundamental frequency of the amplifier circuit.

$$Z_0 = \sqrt{\frac{L}{C}}$$ (9)

$$\theta = \arccos\sqrt{1 - \omega_0^2 LC}$$

Therefore, the circuit of the capacitor 10 and the inductor 11 in FIG. 5 is replaced by the distributed circuit 31 in FIG. 6, and the circuit of the capacitor 12 and the inductor 13 in FIG. 5 is replaced by the distributed circuit 32 in FIG. 6. The operation of the amplifier circuit is same between those shown in FIGS. 4 and 6.

What is claimed is:

1. An amplifier circuit operating at a fundamental angular frequency $\omega_0$, comprising:
    a transistor which is represented by an equivalent circuit which comprises:
        an equivalent output current source;
        a drain-source capacitor as a parallel parasitic capacitor to an output node of said equivalent output current source; and
        a drain inductor as serial parasitic inductor connected between said equivalent output current source and a drain output node;
    a harmonic frequency processing circuit which comprises:
        an input node connected with said drain output node;
        an output node;
        a ladder circuit of n (n=1, 2, 3, . . . ) stages provided between said input node and said output node, wherein each of said n stages comprises a parallel capacitor and a serial inductor;
    a resonant circuit section provided between the output node of said harmonic frequency processing circuit and a ground node and comprising (2n+1) resonators which have resonance frequencies different from each other; and
    a load resistor provided in a back stage of said harmonic frequency processing circuit,
    wherein the resonance frequencies of said (2n+1) resonators correspond with frequencies of (n+1) poles and n zeros formed between said drain output node and said ground node in said transistor when said output node of said harmonic frequency processing circuit is short-circuited to said ground node, and
    wherein the resonance frequencies of 2n resonators of said (2n+1) resonators coincident correspond with a frequency ($2\omega_0$) of second harmonic wave to a frequency of $(2n+1)^{th}$ harmonic wave $((2+1)\omega_0)$, respectively.

2. The amplifier circuit according to claim 1, wherein said (2n+1) resonators comprises a capacitor and an inductor which are connected in series,
    wherein said (2n+1) resonators are short-circuited in the frequencies of the (n+1) poles and the n zeros formed between said output node of said equivalent output current source and said ground node, when said output node of said harmonic frequency processing circuit is short-circuited.

3. The amplifier circuit according to claim 1, wherein said resonant circuit section comprises as said (2n+1) resonators, (2n+1) tip-opened stubs having ¼ of wavelengths of said resonance frequencies and short-circuited in the frequencies of the (n+1) poles and the n zeros formed between said output node of said equivalent output current source and said ground node, when said output node of said harmonic frequency processing circuit is short-circuited.

4. The amplifier circuit according to claim 1, further comprising:
    a matching circuit provided between a back stage of said harmonic frequency processing circuit and a front stage of said load resistor and corresponding to the fundamental angular frequency $\omega_0$.

* * * * *